(12) United States Patent
Raghavan et al.

(10) Patent No.: US 12,176,053 B2
(45) Date of Patent: Dec. 24, 2024

(54) WORDLINE SYSTEM ARCHITECTURE SUPPORTING ERASE OPERATION AND I-V CHARACTERIZATION

(71) Applicant: GLOBALFOUNDRIES U.S. Inc., Malta, NY (US)

(72) Inventors: Ramesh Raghavan, Narsingi (IN); Balaji Jayaraman, Hyderabad (IN); Ming Yin, Suffern, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 713 days.

(21) Appl. No.: 17/380,688

(22) Filed: Jul. 20, 2021

(65) Prior Publication Data

US 2023/0027165 A1 Jan. 26, 2023

(51) Int. Cl.
*G11C 29/00* (2006.01)
*G11C 7/12* (2006.01)
*G11C 8/08* (2006.01)
*G11C 29/50* (2006.01)

(52) U.S. Cl.
CPC .......... *G11C 29/50004* (2013.01); *G11C 7/12* (2013.01); *G11C 8/08* (2013.01); *G11C 2029/5004* (2013.01); *G11C 2029/5006* (2013.01)

(58) Field of Classification Search
CPC ....... G11C 29/50004; G11C 7/12; G11C 8/08; G11C 2029/5004; G11C 2029/5006; G11C 11/4085
See application file for complete search history.

(56) References Cited

U.S. PATENT DOCUMENTS

| | | | |
|---|---|---|---|
| 5,463,586 A * | 10/1995 | Chao | G11C 29/025 365/185.23 |
| 9,025,386 B1* | 5/2015 | Iyer | G11C 11/5671 365/185.18 |
| 9,330,751 B2 | 5/2016 | Nagle et al. | |
| 9,659,604 B1* | 5/2017 | Raghavan | G11C 5/063 |
| 2004/0230736 A1 | 11/2004 | Leconte et al. | |
| 2015/0138867 A1* | 5/2015 | Kirihata | G11C 11/5671 327/333 |
| 2015/0138868 A1* | 5/2015 | Castalino | G11C 16/0466 365/104 |
| 2015/0318043 A1* | 11/2015 | Chishti | G11C 17/14 365/185.21 |
| 2017/0256468 A1* | 9/2017 | Viraraghavan | H01L 22/22 |
| 2019/0108894 A1* | 4/2019 | Fifield | G11C 16/0408 |

* cited by examiner

*Primary Examiner* — Mushfique Siddique
(74) *Attorney, Agent, or Firm* — David Cain; Andrew M. Calderon; Calderon Safran & Wright P.C.

(57) ABSTRACT

The present disclosure relates to integrated circuits, and more particularly, to a wordline system architecture supporting an erase operation and current-voltage (I-V) characterization and methods of manufacture and operation. In particular, the present disclosure relates to a structure including: a twin cell circuit which is connected to a wordline of a memory array; a sourceline driver which is connected to a sourceline of the memory array for providing a cell level current-voltage (I-V) access of the twin cell circuit; and an integrated analog multiplexor which is connected to the twin cell circuit.

20 Claims, 8 Drawing Sheets

WORDLINE SYSTEM ARCHITECTURE SUPPORTING ERASE OPERATION AND I-V CHARACTERIZATION

FIELD OF THE INVENTION

The present disclosure relates to integrated circuits, and more particularly, to a wordline system architecture supporting an erase operation and current-voltage (I-V) characterization and methods of manufacture and operation.

BACKGROUND

In memory, a sense amplifier is one of the elements which make up the circuitry on a semiconductor memory chip. The sense amplifier is part of a read circuitry that is used when data is read from the memory. The sense amplifier senses low power signals from a bitline that represents a data bit (1 or 0) stored in a memory cell, and amplifies a small voltage swing to recognizable logic levels so that the data can be integrated by logic outside of the memory.

In a static random-access memory (SRAM) operation, to read a bit from a particular memory cell a wordline and the particular memory cell's row is turned on, which activates all of the cells in the row. The stored value (0 or 1) from the particular memory cell is then sent to the bitlines associated with the particular memory cell. The sense amplifier at the end of two complimentary bitlines amplifies small voltages to normal logic level. The bit from the desired cell is then latched from the particular memory cell's sense amplifier into a buffer, and placed on an output bus.

In a dynamic random-access memory (DRAM) operation, the sense amplifier is similar to SRAM, but performs an additional function. Specifically, the data in DRAM chips is stored as electric charge in capacitors in memory cells. The read operation depletes the charge in a cell, destroying the data, so after the data is read out, the sense amplifier must immediately write it back in the cell by applying a voltage to it (i.e., memory refresh). In known circuits as described above, a current-voltage (I-V) characterization can be performed only on discrete devices, but not on field effect transistors (FETs) in a functional memory array.

SUMMARY

In an aspect of the disclosure, a structure comprises: a twin cell circuit which is connected to a wordline of a memory array; a sourceline driver which is connected to a sourceline of the memory array for providing a cell level current-voltage (I-V) access of the twin cell circuit; and an integrated analog multiplexer which is connected to the twin cell circuit.

In another aspect of the disclosure, a circuit comprises: a twin cell memory array which comprises at least one twin cell circuit connected to a wordline, a bitline true signal, and an integrated analog multiplexor circuit which is configured to supply multiple voltages as input to a wordline driver circuit based on a predetermined mode of the at least one twin cell circuit.

In another aspect of the disclosure, a method comprises: enabling a wordline which is connected to a twin cell circuit of a memory array using an integrated analog multiplexer; and measuring current over a voltage range of the twin cell circuit in a current saturation monitoring mode.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
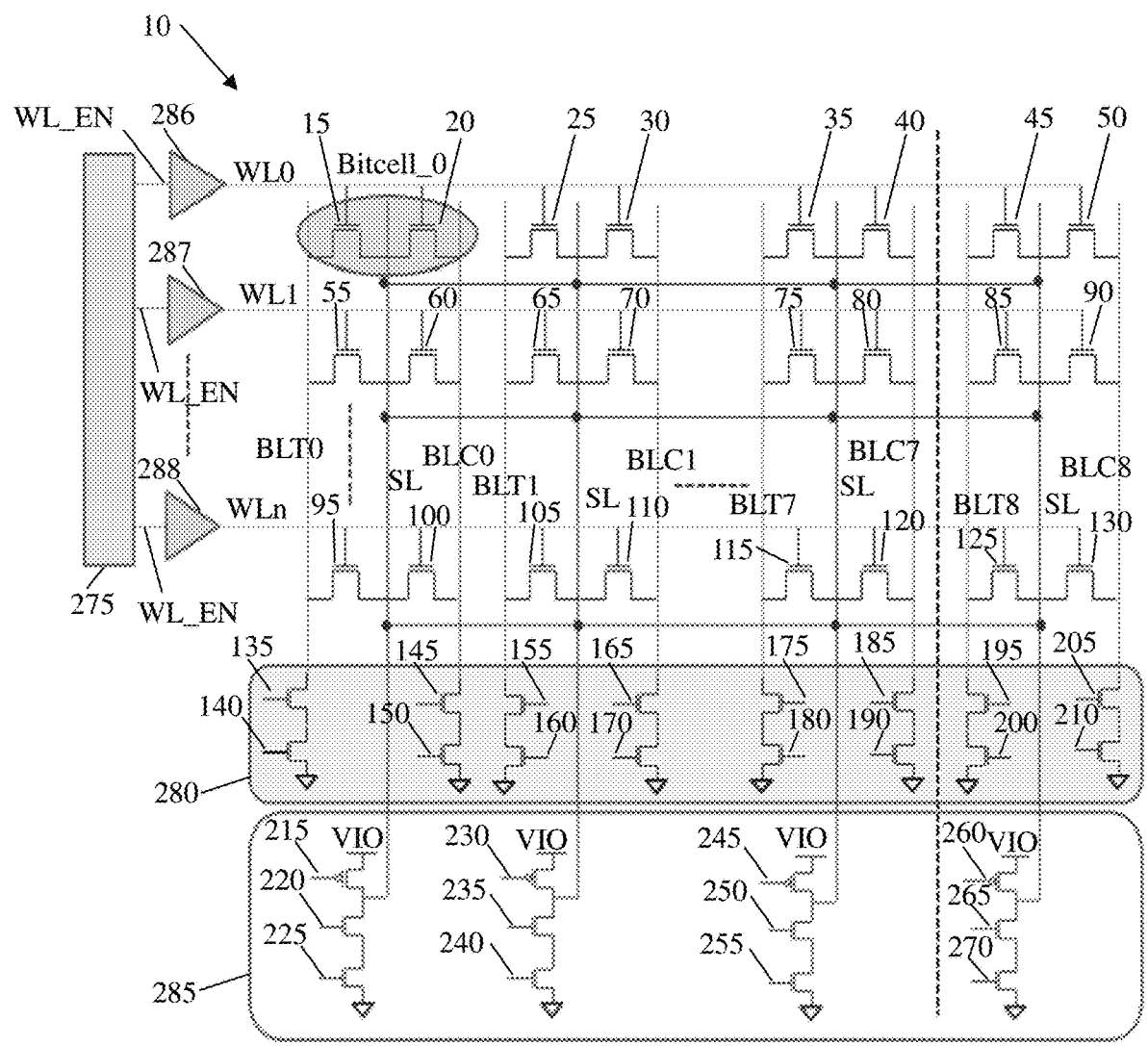
FIG. 1 shows a wordline system testing architecture in a memory structure in accordance with aspects of the present disclosure.

The present disclosure relates to integrated circuits, and more particularly, to a wordline system architecture supporting an erase operation and current-voltage (I-V) characterization and methods of manufacture and operation. More specifically, in the wordline system the wordline can be taken to a negative voltage during an erase operation. Further, the wordline system can be taken to any value between zero ("0") volts and a power supply VDD to support current-voltage (I-V) characterization of a bit-cell in a functional memory array during debug mode. In further embodiments, the wordline system helps to correlate a bit-cell array with a discrete device for various modes of operation (i.e., native state, programming operation, and erase operation). Advantageously, the memory system supports multiple modes of operation, including a read operation, a program operation, an erase operation, and a current saturation monitor operation (i.e., Idsatmonitor) for current-voltage (I-V) characterization of a single bitcell in a memory array.

In known circuits, a current-voltage (I-V) characterization is performed only on discrete devices. For example, known circuits cannot perform current-voltage (I-V) characterization on field effect transistors (FETs) in a memory array. In known circuits, a sourceline SL has a zero value, a power supply is raised to a high voltage level (e.g., VDD level), a wordline is raised to a voltage read VREAD level, and a bitline is sensed. In particular, for the sensing operation (i.e., read operation) of the bitline, a threshold voltage of one field effect transistor (FET) in a bitcell (i.e., a twin cell array) is increased with respect to the other field effect transistor (FET) of the bitcell (i.e., the twin cell array). Then, a bitline and a complement bitline are sensed such that a "0" or "1" is sensed on the bitline and the complement bitline in the sensing operation (i.e., read operation). The sensing operation on the bitline and the complement bitline is performed using a sense amplifier which senses a "0" or "1" of a discrete device in the memory array. However, the known circuits cannot perform the I-V characterization on the FETs in the memory array. In contrast, the present disclosure performs the I-V characterization using a current saturation monitor operation (i.e., Idsatmonitor) for the FETs in the memory array.

In embodiments, the wordline system architecture includes a twin cell circuit which is connected to a wordline of a memory array, and a source line driver which is connected to a source line of the memory array for providing a cell level current-voltage (I-V) access of the twin cell circuit. In alternative embodiments, a circuit may include a twin cell memory array which includes at least one twin cell circuit connected to a wordline, a bitline true signal, and a bitline complement signal, a bitline driver circuit which is connected to the bitline true signal and the bitline complement signal, and a source line driver circuit which is connected to a sourceline of the twin cell memory array. Further embodiments include a method of enabling a wordline which is connected to a twin cell circuit of a memory array, and measuring current over a voltage range of the twin cell circuit in a current saturation monitoring mode.

FIG. 1 shows a wordline system testing architecture in a memory structure in accordance with aspects of the present disclosure. The wordline system testing architecture circuit 10 includes a memory array which includes n-type metal-oxide-semiconductor (NMOS) transistors 15, 20, 25, 30, 35, 40, 45, 50, 55, 60, 65, 70, 75, 80, 85, 90, 95, 100, 105, 110, 115, 120, 125, and 130. As an example, a bitcell_0 (e.g., a twin-cell array) includes the NMOS transistors 15 and 20. The remaining transistors may also be part of separate bitcells (e.g., NMOS transistors 25 and 30 are part of the twin-cell array bitcell_1, NMOS transistors 35 and 40 are part of the twin-cell array bitcell_7, NMOS transistors 45 and 50 are part of the twin-cell array bitcell_8, etc.) with similar characteristics as the bitcell_0. The wordline system testing architecture circuit 10 also includes bitlines BLT0, BLT1, . . . , BLT7, complement bitlines BLC0, BLC1, . . . , BLC7, BLC8, a source line SL, wordline enable signals WL_EN, wordlines WL0, WL1, . . . , WLn, a row decoder 275, bitline drivers 280, distributed sourceline drivers 285, and wordline drivers 286, 287, and 288.

The NMOS transistors 15, 20, 25, 30, 35, 40, 45, and 50 are connected to each other in series. In embodiments, gates of the NMOS transistors 15, 20, 25, 30, 35, 40, 45, and 50 are connected to the wordline WL0. The NMOS transistors 55, 60, 65, 70, 75, 80, 85, and 90 are connected to each other in series. The gates of the NMOS transistors 55, 60, 65, 70, 75, 80, 85, and 90 are all connected to the wordline WL1. The NMOS transistors 95, 100, 105, 110, 115, 120, 125, and 130 are connected to each other in series. The gates of the NMOS transistors 95, 100, 105, 110, 115, 120, 125, and 130 are connected to the wordline WLn. The row decoder 275 is connected to the wordlines WL0, WL1, and WLn through the wordline drivers 286, 287, and 288.

The bitline drivers 280 of the wordline system testing architecture circuit 10 includes NMOS transistors 135, 140, 145, 150, 155, 160, 165, 170, 175, 180, 185, 190, 195, 200, 205, 210. The NMOS transistors 135 and 140 are connected in series, the NMOS transistors 145 and 150 are connected in series, the NMOS transistors 155 and 160 are connected in series, the NMOS transistors 165 and 170 are connected in series, the NMOS transistors 175 and 180 are connected in series, the NMOS transistors 185 and 190 are connected in series, the NMOS transistors 195 and 200 are connected in series, and the NMOS transistors 205 and 210 are connected in series.

In embodiments, NMOS transistors 135, 140 are connected to the bitline BLT0, NMOS transistors 145,150 are connected to the complement bitline BLC0, NMOS transistors 155,160 are connected to the bitline BLT1, NMOS transistors 165,170 are connected to the complement bitline BLC1, NMOS transistors 175,180 are connected to the bitline BLT7, NMOS transistors 185,190 are connected to the complement bitline BLC7, NMOS transistors 195, 200 are connected to the bitline BLT8, and NMOS transistors 205, 210 are connected to the complement bitline BLC8.

The distributed source line drivers 285 of the wordline system testing architecture circuit 10 includes PMOS transistors 215, 230, 245, and 260 and NMOS transistors 220, 225, 235, 240, 250, 255, 265, and 270. The PMOS transistors 215 and NMOS transistors 220 and 225 are connected in series, the PMOS transistors 230 and NMOS transistors 235 and 240 are connected in series, the PMOS transistors 245 and NMOS transistors 250 and 255 are connected in series, and the PMOS transistors 260 and NMOS transistors 265 and 270 are connected in series.

In embodiments, the sourceline SL is connected between the PMOS transistor 215 and the NMOS transistor 220, the PMOS transistor 230 and the NMOS transistor 235, the PMOS transistor 245 and the NMOS transistor 250, the PMOS transistor 260 and the NMOS transistor 265. The distributed source line drivers 285 support a Primary Data Line (PDL) with 8 to 1 column decoding.

In operation of the wordline system testing architecture circuit 10 a floor current extraction operation may be performed to characterize leakage current. In particular, the floor current extraction operation turns off a wordline enable WL_EN signal to the wordline drivers 286, 287, and 288 and measures a floor current through a voltage of the sourceline VSL. Further, a cell current-voltage (I-V) characteristic operation may be performed in which in which the cell I-V characteristic operation pulls one of the bitlines BLT0, BLT1, . . . , BLT7, and BLT8 to zero ("0") volts, changes the voltage of the source line VSL to approximately 0.8 volts, changes the wordline WL to a voltage value in a range between 0 volts and a level of the power supply VDD, and enables the wordline enable WL_EN signal to the wordline drivers 286, 287, and 288 to receive a cell level access for at least one of a write operation and the current saturation monitor operation (i.e., Idsatmonitor) for the FETs in the memory array. In particular, the cell level access for the write operation and the current saturation monitor operation (i.e., Idsatmonitor) for the FETs in the memory array measure current at the voltage input/output VIO point since the voltage input/output VIO point is going to the voltage of the source line VSL. Also, the floor current through the voltage of the sourceline VSL is removed from the current at the voltage input/output VIO point to minimize leakage current effects (i.e., current at the voltage input/output VIO point with WL_EN enabled minus the floor current through the voltage of the sourceline VSL with the WL_EN turned off to minimize leakage current effects) to provide an accurate cell current-voltage (I-V) characteristics.

In the wordline system testing architecture circuit 10, the voltage of the sourceline VSL regulator bypass mode may also be used to measure the floor current through the voltage of the source line VSL to minimize leakage current effects. In a non-limiting example, a typical floor current is less than 100 µA for 12 kilobytes (Kb) selection out of 96 kilobytes (Kb) (i.e., 8 VSL domains). Further, a multi voltage of the source line VSL domain may be used for large arrays to perform a cell current-voltage (I-V) characteristic operation.

In the wordline system testing architecture circuit 10, a maximum voltage program VPP level may be greater than a maximum voltage erase VERASE. Further, the wordline system testing architecture circuit 10 may include a voltage read VREAD level which is greater than or equal to the voltage read reference VRREF level. For example, the maximum voltage program VPP level may be 3.6 volts, the maximum voltage erase VERASE may be −1.8 volts, the voltage read VREAD level may be in a range between zero ("0") volts to the power supply VDD, and the voltage read reference VRREF level may be in a range between zero ("0") volts and −0.5 volts. It should be understood by those of skill in the art that other values are also contemplated herein.

Moreover, a read operation may be performed with a selected wordline WL having a voltage read VREAD level (e.g., 0.5 volts) and an unselected wordline WL having a voltage read reference VRREF level (e.g., −0.4 volts). In embodiments, the voltage read reference VRREF level may be a negative value to minimize current leakage effects. In contrast, known circuits of the unselected wordline WL have a second power supply VSS value (e.g., 0 volts), but do not account for current leakage effects.

In further embodiments, a program operation may also be performed with a selected wordline WL having a voltage program VPP level (e.g., 2.8 volts) and an unselected wordline WL having the voltage read reference VRREF level (e.g., −0.4 volts). Moreover, an erase operation (i.e., bulk erase) may be performed with a selected wordline WL having a voltage erase VERASE level (e.g., −1.5 volts) and an unselected wordline WL having the voltage erase VERASE level (e.g., −1.5 volts).

In addition, a current saturation monitor operation Idsatmonitor (e.g., performs the current-voltage (Id-Vg) characterization) may also be performed with a selected wordline WL in a range between zero ("0") volts to the power supply VDD and an unselected wordline WL at the voltage read reference VRREF level (e.g., −0.4 volts). In contrast, known systems perform read and program operations, but are not able to perform a current saturation monitor operation Idsatmon.

Figure 2:
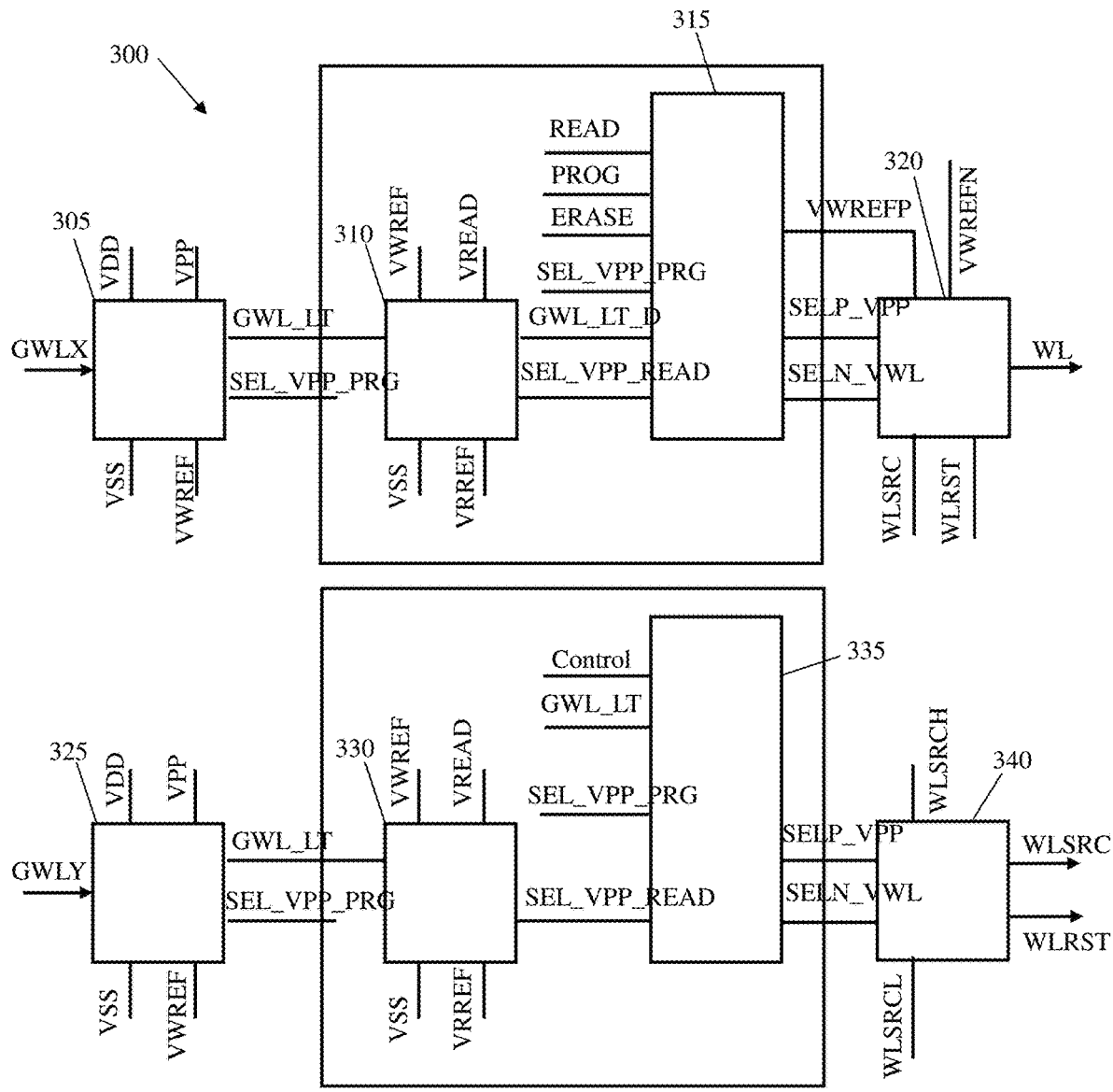
FIG. 2 shows a block diagram of the wordline system testing architecture in the memory structure in accordance with aspects of the present disclosure.

FIG. 2 shows a block diagram of the wordline system testing architecture in the memory structure in accordance with aspects of the present disclosure. In the block diagram 300, an uplevel translator 305 receives a global wordline x GWLX signal, the power supply VDD, the voltage program VPP level, the power supply VSS, and the voltage word reference VWREF signal. The uplevel translator 305 outputs the global wordline for level translator GWL_LT signal to a down level translator 310 and a selection voltage program SEL_VPP_PRG signal. The down level transistor 310 receives the global wordline for a level translator GWL_LT, the voltage read VREAD level, the voltage word reference VWREF signal, the power supply VSS, and the voltage read reference VRREF level. The down level transistor 310 outputs the global wordline level transistor driver GWL_LT_D signal and the selection voltage program read SEL_VPP_READ signal to a wordline driver selection logic 315.

The wordline driver selection logic 315 receives the global wordline level transistor driver GWL_LT_D, the selection voltage program read SEL_VPP_READ signal, a read enable READ signal, a program enable PROG signal, an erase enable ERASE signal, and selection voltage program SEL_VPP_PRG signal. The wordline driver selection logic 315 also and outputs a voltage word reference p VWREFP signal, a selection p program SELP_VPP signal, and a selection n program voltage wordline SELN_VWL signal to a local wordline driver 320. The local wordline driver 320 receives the voltage word reference p VWREFP signal, the selection p program SELP_VPP signal, and the selection n program voltage wordline SELN_VWL signal, a wordline source WLSRC signal, a wordline reset WLRST signal, and a voltage wordline reference n VWREFN signal and outputs the wordline WL.

In the block diagram 300, an uplevel translator 325 receives a global wordline y GWLY signal, the power supply VDD, the voltage program VPP level, the second power supply VSS, and the voltage word reference VWREF signal and outputs the global wordline for level translator GWL_LT signal to a down level translator 330 and the selection voltage program SEL_VPP_PRG signal. The down level transistor 330 receives the global wordline for level translator GWL_LT, the voltage read VREAD level, the voltage word reference VWREF signal, the power supply VSS, and the voltage read reference VRREF level and outputs the selection voltage program read SEL_VPP_READ signal to a wordline driver selection logic 335.

The wordline driver selection logic 335 receives the selection voltage program read SEL_VPP_READ signal, a control CONTROL signal, the global wordline for level translator GWL_LT, the selection voltage program SEL_VPP_PRG signal and outputs a selection p program SELP_VPP signal and a selection n program voltage wordline SELN_VWL signal to a local wordline driver 340. The local wordline driver 340 receives the selection p program SELP_VPP signal, the selection n program voltage wordline SELN_VWL signal, a wordline source low WLSRCL signal, a wordline source high WLSRCH signal and outputs the wordline source WLSRC signal and the wordline reset WLRST signal.

The wordline driver selection logic 315 and the wordline driver selection logic 335 includes an analog complex multiplexer integrated switch 400 which is configured to perform the current saturation monitor operation Idsatmonitor (e.g., performing the current-voltage (Id-Vg) characterization). As stated above, the wordline driver selection logic 315 and the wordline driver selection logic 335 perform the current-voltage (Id-Vg) characterization, which cannot be performed in known circuits. The analog complex multiplexer integrated switch 400 may also be used to prohibit reliability voltage limit violations. The analog complex multiplexer integrated switch 400 for performing the current saturation monitor operation Idsatmonitor (e.g., performing the current-voltage (Id-Vg) characterization) will be discussed in detail in FIGS. 3A, 3B, 4A, and 4B.

Figure 3A:
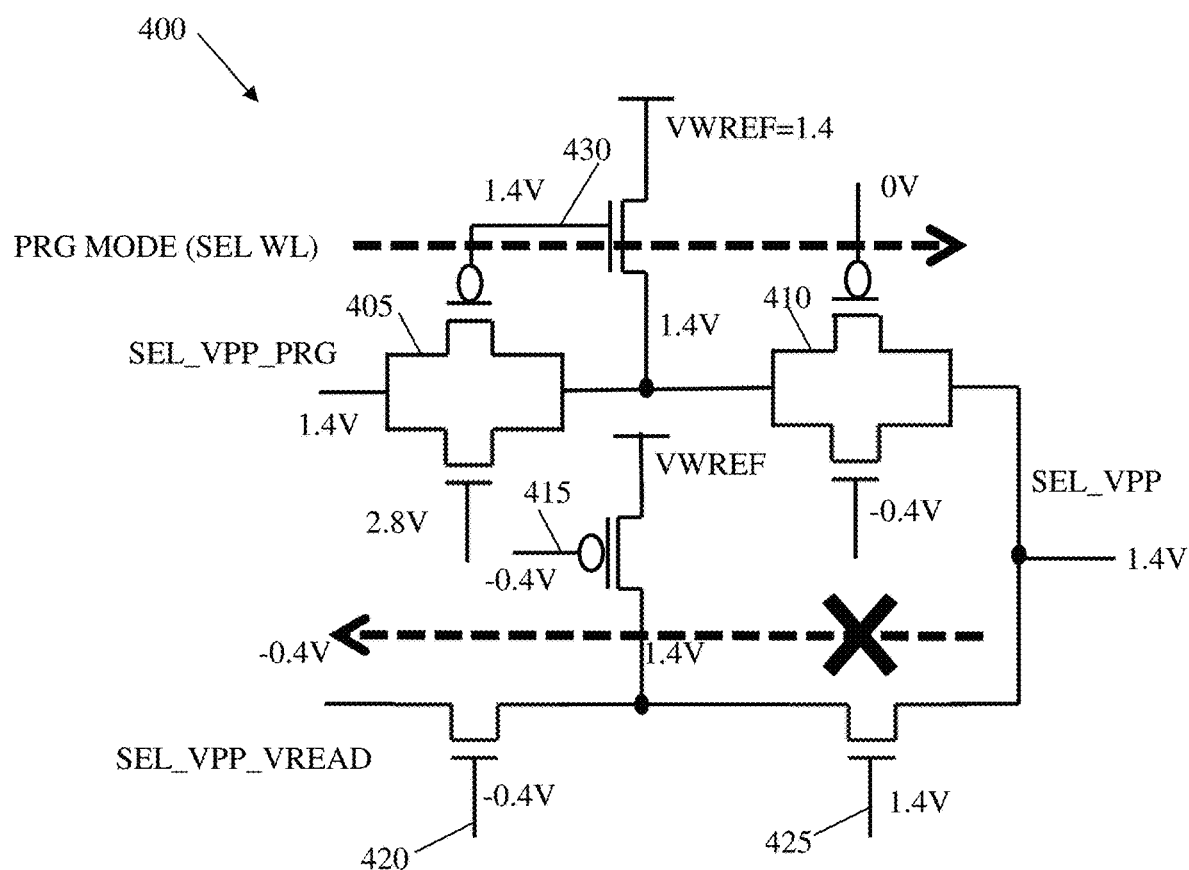
FIGS. 3A and 3B show a program mode of an analog complex multiplexer integrated switch of the wordline system testing architecture in the memory structure in accordance with aspects of the present disclosure.
Figure 3B:
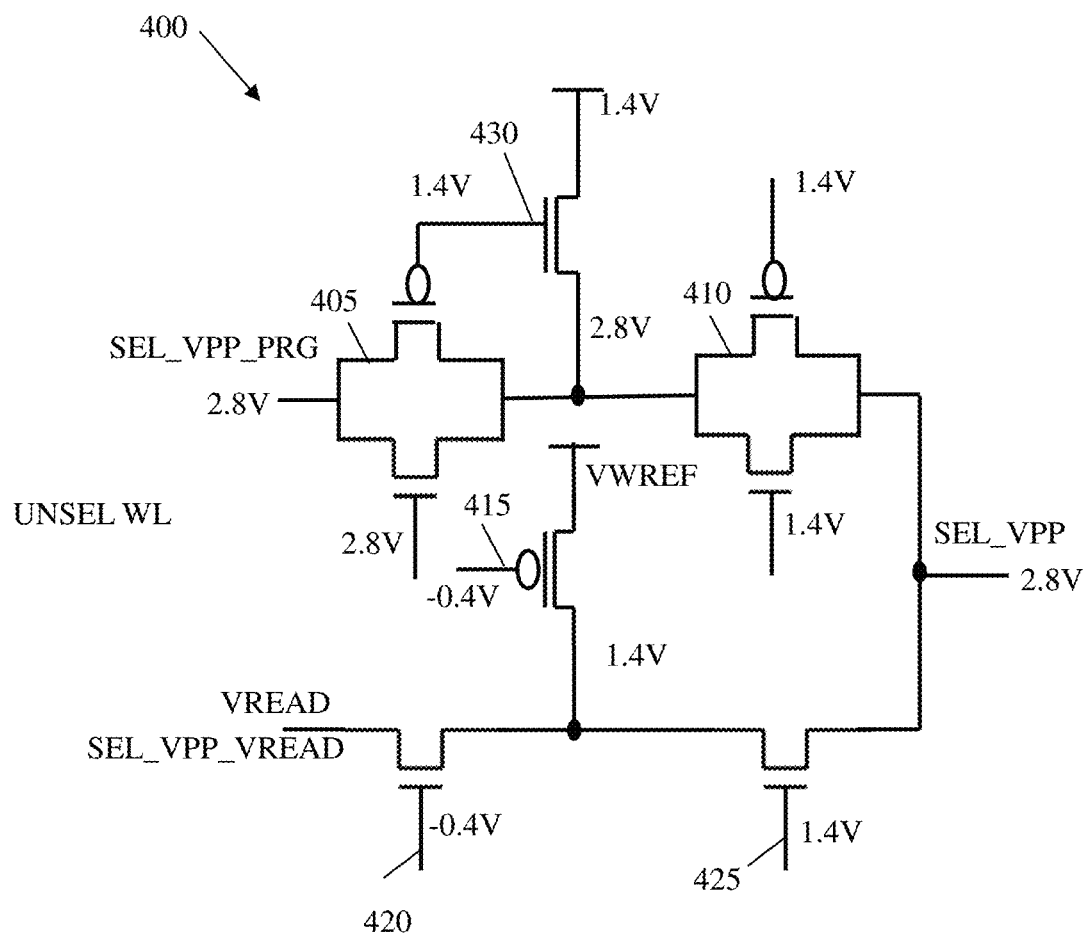

FIGS. 3A and 3B show a program mode of an analog complex multiplexer integrated switch of the wordline system testing architecture in the memory structure. In FIG. 3A, the program mode PRG MODE for a selected wordline SEL WL of the analog complex multiplexer integrated switch 400 of the first wordline driver selection logic 315 and the second wordline driver selection logic 335 is shown. In particular, the analog complex multiplexer integrated switch 400 includes a switch 405, a switch 410, and NMOS transistors 420, 425, and 430. In FIGS. 3A and 3B, different voltage values can be used to prohibit reliability voltage limit violations and support programming characteristics. In the program mode PRG mode for the selected wordline SEL WL of the analog complex multiplexer integrated switch 400, a first voltage may be greater than a second voltage, the second voltage may be greater than a third voltage, and the third voltage may be greater than a fourth voltage. In particular, in an illustrative, non-limiting embodiment, the first voltage can be approximately 2.8 volts, the second voltage can be approximately 1.4 volts, the third voltage can be approximately 0 volts, and the fourth voltage can be approximately −0.4 volts.

In FIG. 3A, for the program mode PRG MODE for the selected wordline SEL WL, a drain of the NMOS transistor 430 has the voltage word reference VWREF signal value of the second voltage. Further, a gate of the NMOS transistor 430 also has a value of the second voltage. The first switch 405 has an input of the second voltage and receives the second voltage at the PMOS portion of the switch 405 and the first voltage at the NMOS portion of the switch 405. This allows the switch 405 to be ON and output the second voltage from the input of the switch 405. In contrast, the switch 410 has an input of the second voltage and receives the third voltage at the PMOS portion of the switch 410 and the fourth voltage at the NMOS portion of the second switch 410. In this scenario, the switch 410 is ON and the second voltage is passed to a selection program SEL_VPP signal.

In FIG. 3A, the PMOS transistor 415 has a source which has the voltage word reference VWREF signal value of the second voltage. Further, a gate of the NMOS transistor has a value of the fourth voltage. As a gate of the NMOS transistor 425 has a value of the second voltage, the second voltage is passed to the drain of the NMOS transistor 415. The NMOS transistor 420 has a gate with a value of the fourth voltage. Therefore, the PMOS transistor 415 may be configured as a protect switch which blocks a reverse condition, as indicated by the "X" in the analog complex multiplexer integrated switch 400. Further, the analog complex multiplexer integrated switch 400 supports four voltage domains; 2.8 volts, 1.4 volts, −0.4 volts, or the read voltage VREAD. The analog complex multiplexer integrated switch 400 also ensures that there is no violation of reliability limits. Further, the analog complex multiplexer integrated switch 400 may be cascaded in a circuit multiple times for N number of voltage domains, where N is an integer.

In FIG. 3B, the program mode PRG MODE for an unselected wordline UNSEL WL of the analog complex multiplexer integrated switch 400 of the wordline driver selection logic 315 and the wordline driver selection logic 335 is shown. In FIG. 3B, for the program mode PRG MODE for the unselected wordline UNSEL WL, a drain of the NMOS transistor 430 has a value of the second voltage. Further, a gate of the NMOS transistor 430 has a value of the second voltage. The switch 405 has an input of the first voltage and receives the second voltage at the PMOS portion of the switch 405 and the first voltage at the NMOS portion of the switch 405. This allows the switch 405 to be ON and output the first voltage from the input of the switch 405. In contrast, the switch 410 has an input of the first voltage and receives the second voltage at the PMOS portion of the switch 410 and the second voltage at the NMOS portion of the second switch 410. In this scenario, the switch 410 is ON and the first voltage is passed to a selection program SEL_VPP signal.

In FIG. 3B, the PMOS transistor 415 has a source which has the voltage word reference VWREF signal value. Further, a gate of the PMOS transistor 415 has a value of the fourth voltage. As a gate of the NMOS transistor 425 has a value of the second voltage, the second voltage is passed to the drain of the NMOS transistor 415. The NMOS transistor 420 has a gate with a value of the fourth voltage. The analog complex multiplexer integrated switch 400 can be cascaded in a circuit multiple times for N number of voltage domains, where N is an integer.

Figure 4A:
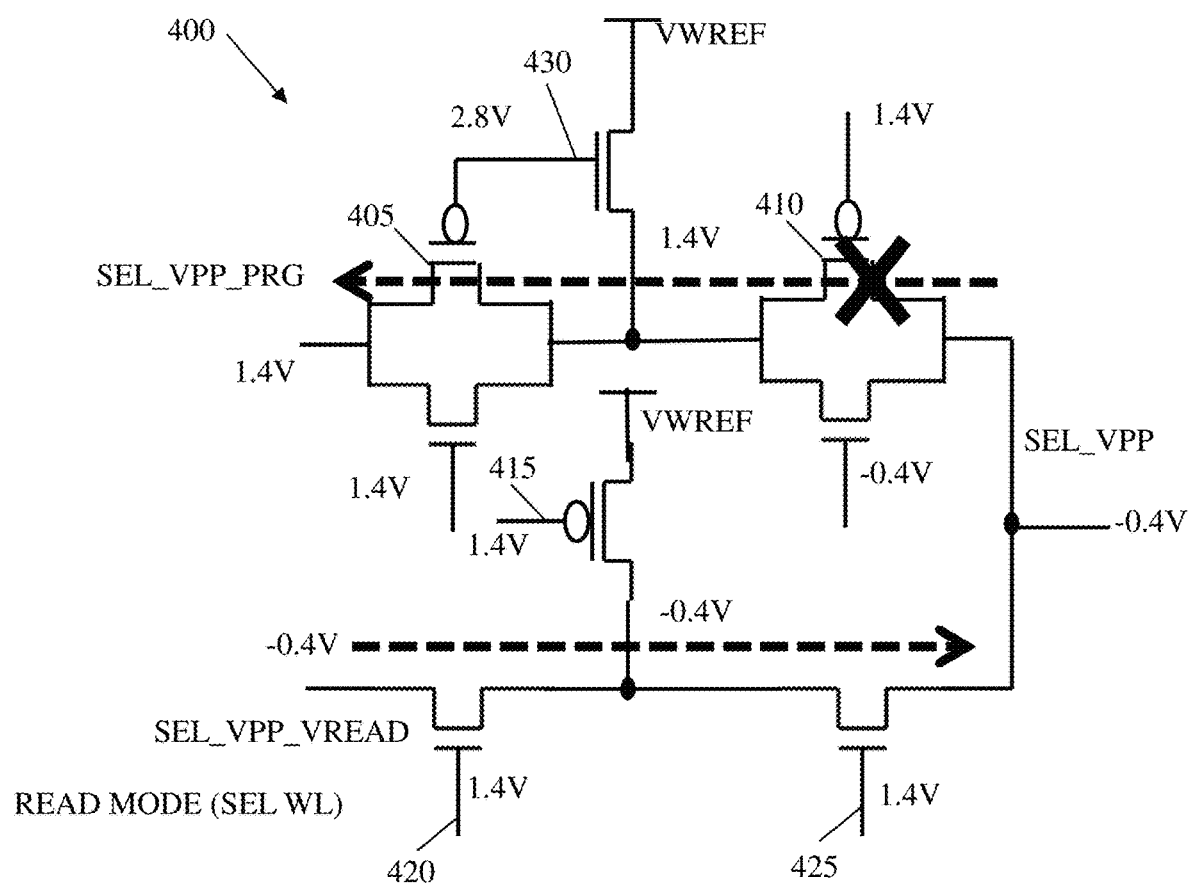
FIGS. 4A and 4B show a read/Idsatmon mode of the analog complex multiplexer integrated switch in accordance with aspects of the present disclosure.
Figure 4B:
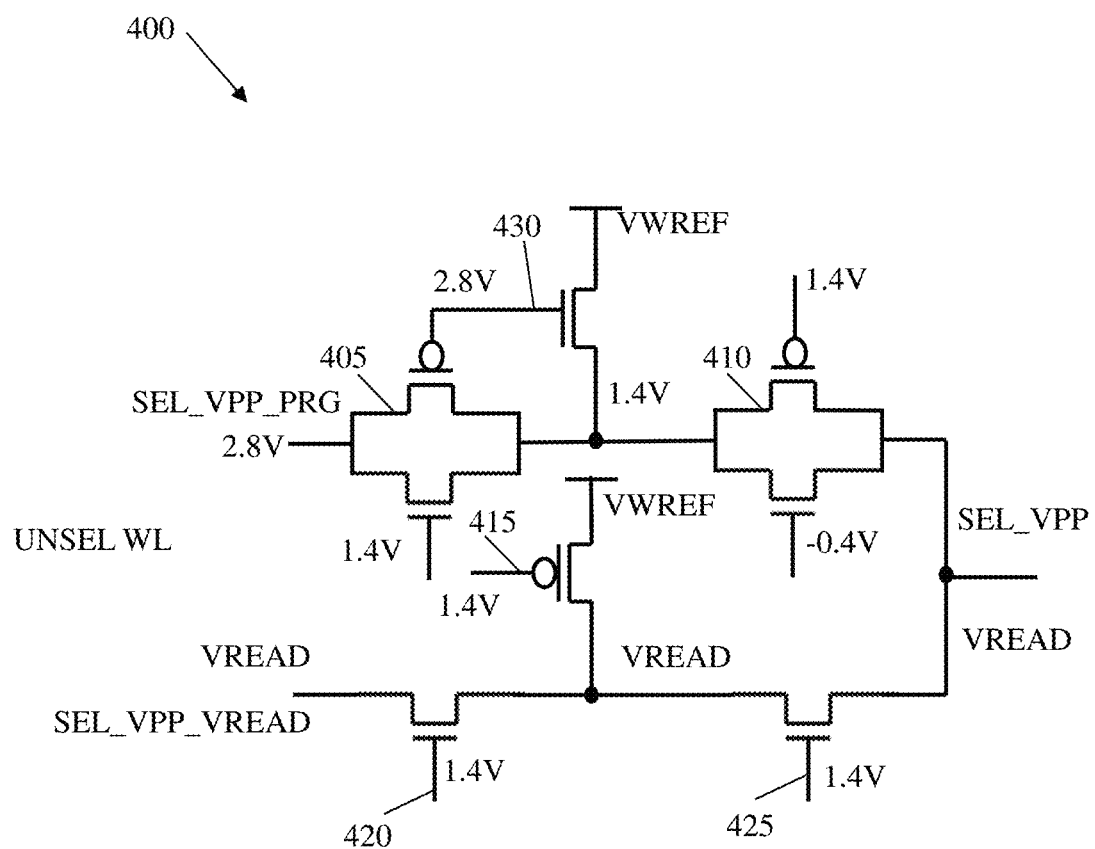

FIGS. 4A and 4B show a read/Idsatmon mode of the analog complex multiplexer integrated switch of the wordline system testing architecture in the memory structure. In FIG. 4A, the read/Idsatmon READ/IDSATMON MODE for a selected wordline SEL WL of the analog complex multiplexer integrated switch 400 of the wordline driver selection logic 315 and the wordline driver selection logic 335 is shown. Similar to FIGS. 3A and 3B, the first voltage, the second voltage, the third voltage, and the fourth voltage can be used in FIGS. 4A and 4B to prohibit reliability voltage limit violations and support cell current-voltage (I-V) characteristics. In the non-limiting example, each of the first, second, third, and fourth voltages can have different voltage values. In the read/Idsatmon READ/IDSATMON mode for the selected wordline SEL of the analog complex multiplexer integrated switch 400, the first voltage can be greater than a second voltage, the second voltage is greater than a third voltage, and the third voltage is greater than a fourth voltage. In particular, in an embodiment, the first voltage can be approximately 2.8 volts, the second voltage can be approximately 1.4 volts, the third voltage can be approximately 0 volts, and the fourth voltage can be approximately -0.4 volts.

In FIG. 4A, for the READ/IDSATMON MODE for the selected wordline SEL WL, a drain of the NMOS transistor 430 has the voltage word reference VWREF signal. Further, a gate of the NMOS transistor 430 has a value of the first voltage. The first switch 405 has an input of the second voltage and receives the first voltage at the PMOS portion of the first switch 405 and the second voltage at the NMOS portion of the first switch 405. The second switch 410 has an input of the second voltage and receives the second voltage at the PMOS portion of the second switch 410 and the fourth voltage at the NMOS portion of the second switch 410. In this scenario, the second switch 410 is a protect switch which blocks a reverse condition, as indicated by the "X" in the analog complex multiplexer integrated switch 400.

In FIG. 4A, the PMOS transistor 415 has a source which has the voltage word reference VWREF signal value. Further, a gate of the NMOS transistor has a value of the second voltage. Gates of the NMOS transistors 420 and 425 have a value of the second voltage. This allows the fourth voltage to be passed to the selection program SEL_VPP signal. The analog complex multiplexer integrated switch 400 can be cascaded in a circuit multiple times for N number of voltage domains, where N is an integer.

In FIG. 4B, the read/Idsatmon READ/IDSATMON MODE for an unselected wordline UNSEL WL of the analog complex multiplexer integrated switch 400 of the wordline driver selection logic 315 and the wordline driver selection logic 335 is shown. In FIG. 4B, for the read/Idsatmon READ/IDSATMON MODE for the unselected wordline UNSEL WL, a drain of the NMOS transistor 430 has the voltage word reference VWREF signal. Further, a gate of the NMOS transistor 430 has a value of the first voltage. The first switch 405 has an input of the first voltage and receives the first voltage at the PMOS portion of the first switch 405 and the second voltage at the NMOS portion of the first switch 405. The second switch 410 has an input of the second voltage and receives the second voltage at the PMOS portion of the second switch 410 and the fourth voltage at the NMOS portion of the second switch 410.

In FIG. 4B, the PMOS transistor 415 has a source which has the voltage word reference VWREF signal value. Further, a gate of the NMOS transistor has a value of the second voltage. As gates of the NMOS transistors 420 and 425 have a value of the second voltage, the voltage read VREAD level is passed to the output. The analog complex multiplexer integrated switch 400 can be cascaded in a circuit multiple times for N number of voltage domains, where N is an integer.

Figure 5A:
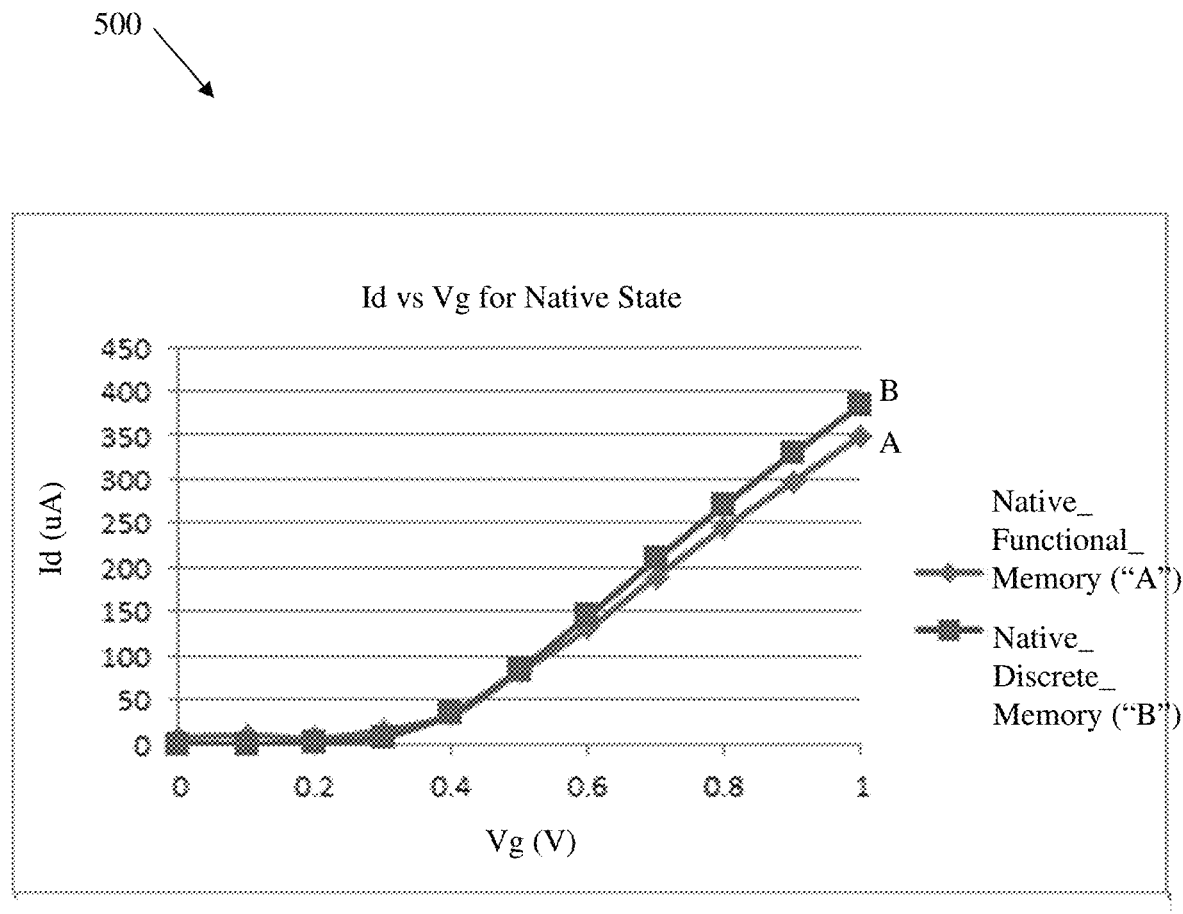
FIGS. 5A and 5B show graphs of the current Id versus voltage Vg for different modes and states of the wordline system testing architecture in the memory structure in accordance with aspects of the present disclosure.
Figure 5B:
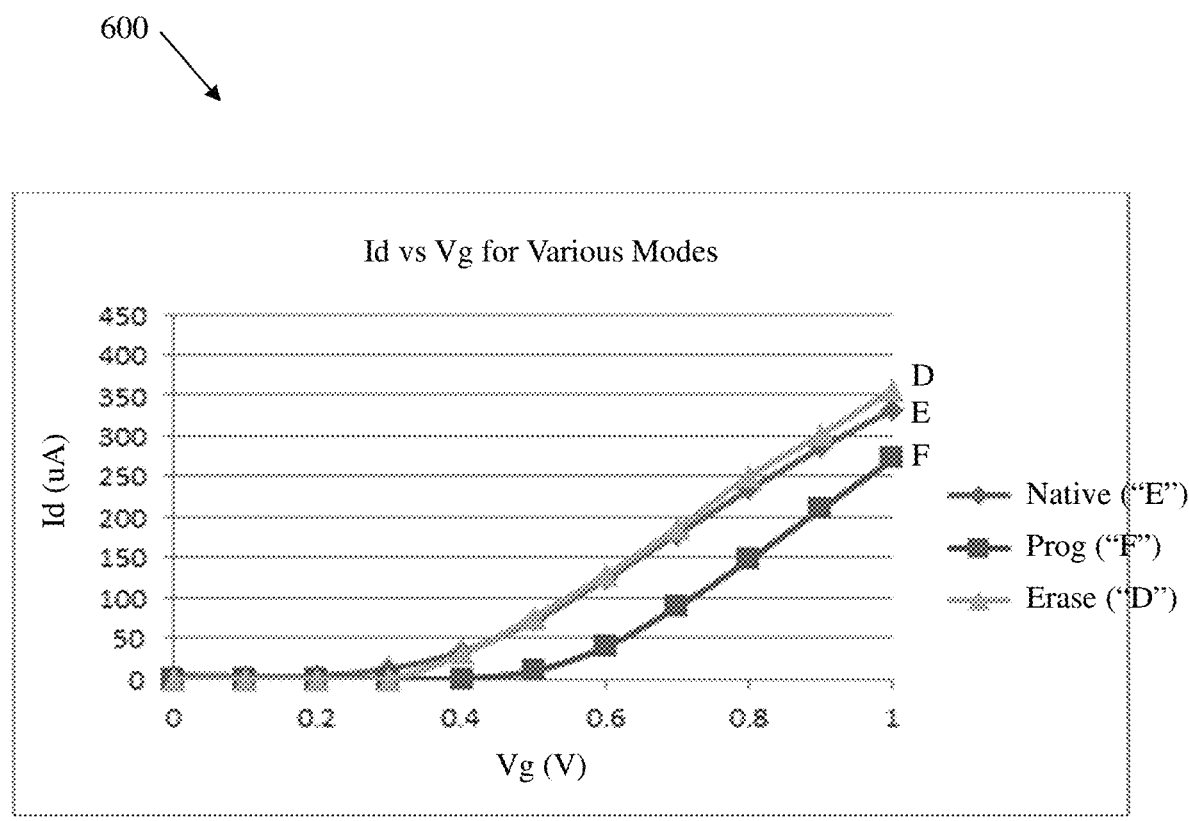

FIGS. 5A and 5B show graphs of the current Id versus voltage Vg for different modes and states of the wordline system testing architecture in the memory structure in accordance with aspects of the present disclosure. In FIG. 5A, graph 500 includes a gate voltage Vg on the x-axis and a drain current Id in μA on the y-axis. The graph 500 shows that in the native state (i.e., uninitiated state), the circuitry described herein can measure both the I-V characteristics of the functional memory (i.e., field effect transistors) and the discrete memory. In particular, the native_discrete_memory ("B") has similar I-V characteristics to the native_functional_memory ("A") below approximately 0.6 volts. Above approximately 0.6 volts, the native functional_memory ("A") has a lower current Id than the native_discrete_memory ("B"), as shown in graph 500.

FIG. 5B shows a graph 600 which includes the gate voltage Vg on the x-axis and the drain current Id in μA on the y-axis. The graph 600 shows the I-V characteristics of the native state (i.e., uninitiated state, "E"), a programmed state ("F"), and an erase state ("D") of the functional memory (i.e., field effect transistors). In the graph 600 of FIG. 5B, the programmed state ("F") of the functional memory (i.e., field effect transistors) has a lower current than the native state ("E") and the erase state ("D") at specific voltages above 0.3 volts.

The a wordline system architecture circuit can be manufactured in a number of ways using a number of different tools. In general, though, the methodologies and tools are used to form structures with dimensions in the micrometer and nanometer scale. The methodologies, i.e., technologies, employed to manufacture the sense amplifier circuit has been adopted from integrated circuit (IC) technology. For example, the a wordline system architecture circuit may be built on wafers and realized in films of material patterned by photolithographic processes on the top of a wafer. In particular, the fabrication of the wordline system architecture circuit uses three basic building blocks: (i) deposition of thin films of material on a substrate, (ii) applying a patterned mask on top of the films by photolithographic imaging, and (iii) etching the films selectively to the mask.

The wordline system architecture circuit for current sensing in a memory structure can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a twin cell circuit which is connected to a wordline of a memory array, wherein the wordline of the memory array is disabled during a floor current extraction operation to minimize leakage current of the twin cell circuit;
   a sourceline driver which is connected to a sourceline of the memory array for providing a cell level current-voltage (I-V) access of the twin cell circuit; and
   an integrated analog multiplexor which is connected to the twin cell circuit.

2. The structure of claim 1, wherein the twin cell circuit comprises a first NMOS transistor and a second NMOS transistor.

3. The structure of claim 2, wherein the wordline of the memory array is connected to a gate of the first NMOS transistor and a gate of the second NMOS transistor.

4. The structure of claim 3, wherein the sourceline driver comprises a PMOS transistor, a third NMOS transistor, and a fourth NMOS transistor.

5. The structure of claim 4, wherein the sourceline of the memory array is connected between the PMOS transistor and the third NMOS transistor of the sourceline driver.

6. The structure of claim 1, wherein the cell level I-V access of the twin cell circuit comprises measuring current over a voltage range of the twin cell circuit in at least one of a current saturation monitoring mode and a write mode.

7. The structure of claim 6, wherein the wordline of the memory array is enabled during the at least one of the current saturation monitoring mode and the write mode using the integrated analog multiplexor.

8. The structure of claim 1, wherein a floor current of the sourceline is measured during the floor current extraction operation.

9. The structure of claim 1, wherein the twin cell circuit is connected between a bitline true signal and a bitline complement signal of the memory array.

10. The structure of claim 9, wherein the bitline true signal is set to zero volts and a voltage of the sourceline is set to 0.8 volts.

11. The structure of claim 1, further comprising measuring current provides a cell level current-voltage (I-V) access for both functional memory of a field effect transistor of the memory array and discrete memory.

12. A circuit, comprising:
    a twin cell memory array which comprises at least one twin cell circuit connected to a wordline, a bitline true signal, and a bitline complement signal, wherein the wordline of the twin cell memory array is disabled during a floor current extraction operation to minimize leakage current of the twin cell circuit; and
    an integrated analog multiplexor circuit which is configured to supply multiple voltages as input to a wordline driver circuit of the wordline based on a predetermined mode of the at least one twin cell circuit.

13. The circuit of claim 12, further comprising a bitline driver circuit which is connected to the bitline true signal and the bitline complement signal, and the twin cell circuit comprises a first NMOS transistor and a second NMOS transistor.

14. The circuit of claim 13, wherein the wordline of the memory array is connected to a gate of the first NMOS transistor and a gate of the second NMOS transistor.

15. The circuit of claim 14, further comprising a sourceline driver circuit which is connected to a sourceline of the twin cell memory array, and the sourceline driver circuit comprises a PMOS transistor, a third NMOS transistor, and a fourth NMOS transistor.

16. The circuit of claim 15, wherein the sourceline of the memory array is connected between the PMOS transistor and the third NMOS transistor of the sourceline driver.

17. The circuit of claim 15, wherein the sourceline of the memory array provides a cell level access of the twin cell circuit.

18. The circuit of claim 17, wherein performing the cell level access of the twin cell circuit comprises measuring current over a voltage range of the twin cell circuit in at least one of a current saturation monitoring mode and a write mode.

19. The circuit of claim 18, wherein the wordline of the memory array is enabled during the at least one of the current saturation monitoring mode and the write mode using an integrated analog multiplexer which comprises at least three PMOS transistors and at least two NMOS transistors.

20. A method, comprising:
enabling a wordline which is connected to a twin cell circuit of a memory array using an integrated analog multiplexor;
disabling the wordline of the memory array during a floor current extraction operation to minimize leakage current of the twin cell circuit; and
measuring current over a voltage range of the twin cell circuit of the memory array in a current saturation monitoring mode.

* * * * *